United States Patent [19]

Yamazaki et al.

[11] Patent Number: 5,157,985
[45] Date of Patent: Oct. 27, 1992

[54] X-Y TABLE FOR BONDING DEVICES

[75] Inventors: Nobuto Yamazaki; Minoru Torihata, both of Tokyo, Japan

[73] Assignee: Kabushiki Kaisha Shinkawa, Tokyo, Japan

[21] Appl. No.: 637,297

[22] Filed: Jan. 3, 1991

[30] Foreign Application Priority Data

Jan. 4, 1990 [JP] Japan .................................. 2-25

[51] Int. Cl.⁵ ...................... F16H 29/20; G05G 11/00
[52] U.S. Cl. .................................. 74/479; 74/89.15; 108/143; 108/20
[58] Field of Search ................ 74/479, 89.15; 108/20, 108/143

[56] References Cited

U.S. PATENT DOCUMENTS

| | | | |
|---|---|---|---|
| 3,495,519 | 2/1970 | Alfsen et al. | 108/20 X |
| 4,372,223 | 2/1983 | Iwatani | 108/20 X |
| 4,409,860 | 10/1983 | Moriyama et al. | 74/479 |
| 4,711,537 | 12/1987 | Schindl et al. | 74/479 X |
| 4,916,963 | 4/1990 | Takai | 74/89.15 X |
| 4,919,001 | 4/1990 | Ogiwara et al. | 74/89.15 X |
| 4,934,202 | 6/1990 | Hikita et al. | 74/89.15 |
| 4,964,503 | 10/1990 | Nishiyama et al. | 74/479 X |
| 4,972,574 | 11/1990 | Isono et al. | 74/479 X |

FOREIGN PATENT DOCUMENTS

| | | | |
|---|---|---|---|
| 3413184 | 10/1985 | Fed. Rep. of Germany | 74/89.15 |
| 59-52540 | 12/1984 | Japan. | |
| 1-41466 | 9/1989 | Japan. | |
| 2049091 | 12/1980 | United Kingdom | 74/89.15 |

*Primary Examiner*—Allan D. Herrmann
*Assistant Examiner*—Julie Krolikowski
*Attorney, Agent, or Firm*—Koda and Androlia

[57] ABSTRACT

A horizontal (X-Y) table used in, for example, a bonding device including a lower table movable in one direction on a horizontal plane, an upper table installed on the lower table and movable in the other direction on the horizontal plane, an upper table driving deck which is supported by a bridge that straddles the upper table and is able to make a linear motion in the moving direction of the upper table on the upper table, a driving mechanism for the lower table, a driving mechanism for the upper table driving deck, and a link which connects the upper table and upper table driving deck so as to move them in the moving direction of the lower table, thus minimizing an area to be occupied by the X-Y table.

1 Claim, 4 Drawing Sheets

X-Y TABLE FOR BONDING DEVICES

BACKGROUND OF THE INVENTION

1. Field of the Invention

The present invention relates to an X-Y table and more particularly to an X-Y table used, for example, in semiconductor assembly machines.

2. Prior Art

Bonding devices used in producing semiconductors, etc. use a bonding head mounted on an X-Y table which moves on a horizontally two-dimensional plane. The X-Y table comprises a lower table and an upper table. The lower table moves in one direction on the horizontal plane, and the upper table installed on the lower table moves in the other direction on such a horizontal plane.

Several types of X-Y tables are disclosed in publications such as Japanese patent application publication (Kokoku) Nos. 59-52540 and 1-41466. These tables are for preventing adverse effects to the lower table feeding system. The adverse effect here is the one that is caused by the load generated by the feeding action of the upper table and applied onto a feed-driving means (e.g., feed screw, etc.) of the lower table.

In these X-Y tables, an upper table driving mechanism, which moves in the same direction as the feed direction of the upper table, is installed alongside the lower and upper tables for the purpose of feeding the upper table.

However, since the upper table driving mechanism is installed alongside the lower and upper tables, the installation area occupied by the X-Y table is increased. Such an increase of the installation area is typical when the X-Y table is used in a bonding apparatus.

SUMMARY OF THE INVENTION

Accordingly, the object of the present invention is to provide a compact X-Y table that occupies only a small installation area.

The object is accomplished by a unique structure that includes (a) a lower table which is installed on a base and moves in one direction on a two-dimensional horizontal plane, (b) an upper table which is installed on the lower table and moves in the other direction on such a horizontal plane, (c) an upper table driving deck which is supported by a bridge installed on the base so that the bridge straddles the upper table, the upper table driving deck being able to make a linear motion above the upper table in the direction of movement of the upper table, (d) a feed-driving means for the lower table, (e) a feed-driving means for the upper table driving deck, and (f) a linking means which links the upper table and the upper table driving deck in such a way that these two elements are capable of moving in the direction of movement of the lower table.

The lower table is moved by the lower table feed-driving means in one direction (X direction) on the horizontal plane. Since the upper table is mounted on the lower table, the upper table can move along with the lower table in the X direction. The upper table driving deck is fed in the other direction (Y direction) on the horizontal plane by the feed-driving means used for the upper table driving deck. The movement of the upper table driving deck in the Y direction is transmitted to the upper table by the linking means. In other words, the upper table can be moved in any desired horizontal directions by the feeding action of the lower table in the X direction and by the feeding action of the upper table driving deck in the Y direction.

DETAILED DESCRIPTION OF THE INVENTION

Figure 1:
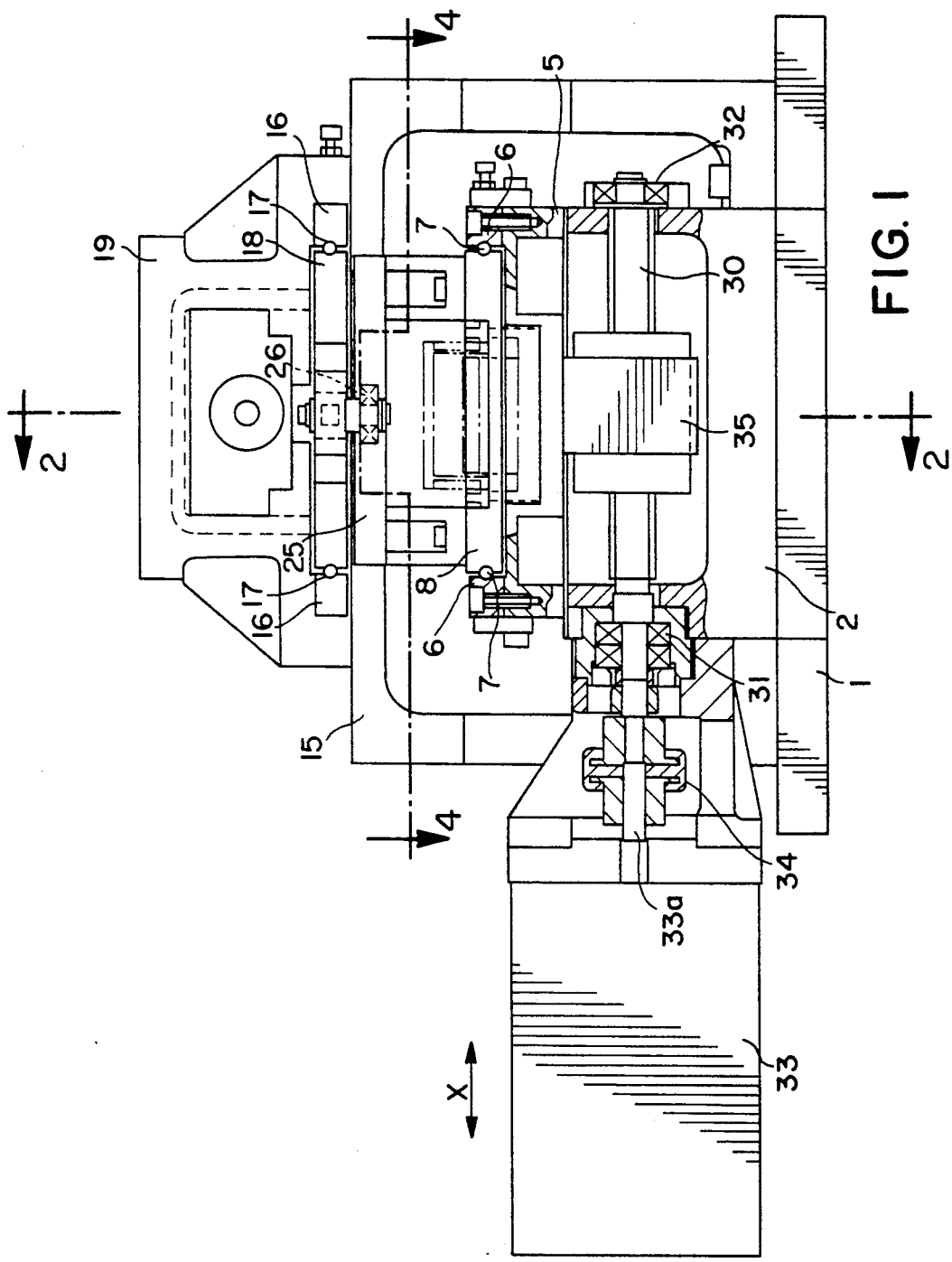
FIG. 1 is a cross-sectional front view of one embodiment of the X- of the present invention.
Figure 2:
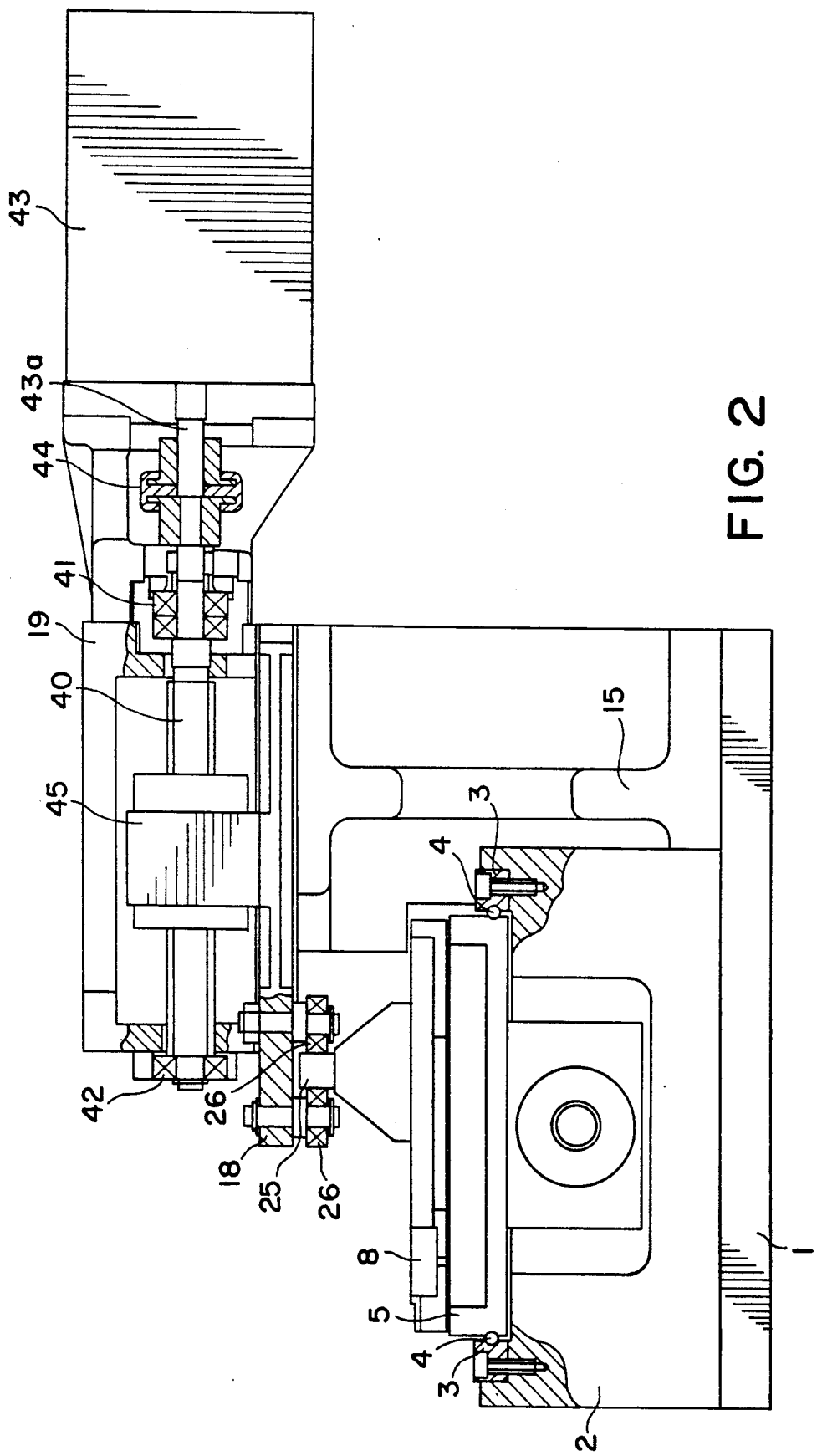
FIG. 2 is a cross-sectional side view taken along the line 2—2 in FIG. 1.
Figure 3:
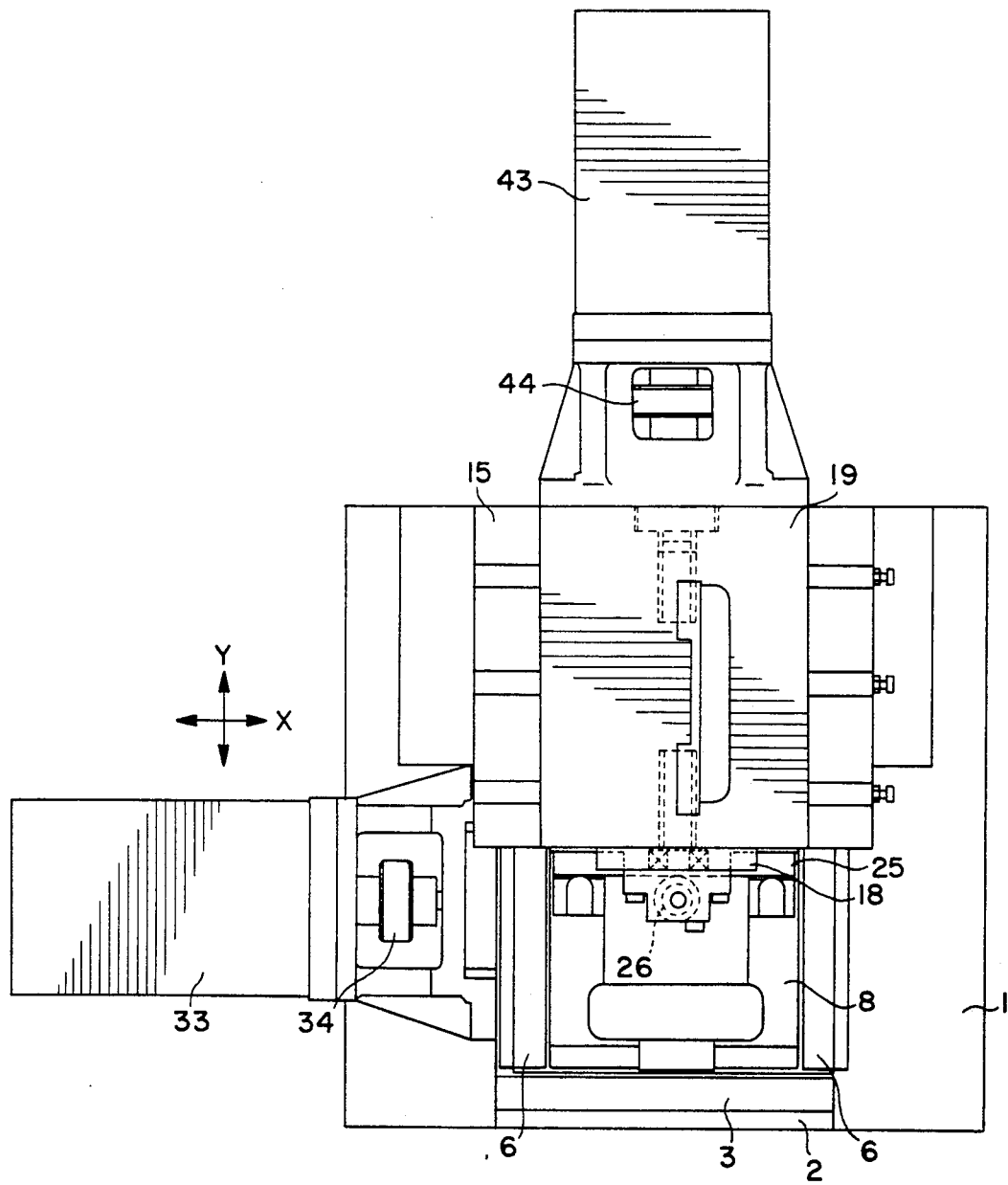
FIG. 3 is a plan view thereof.
Figure 4:
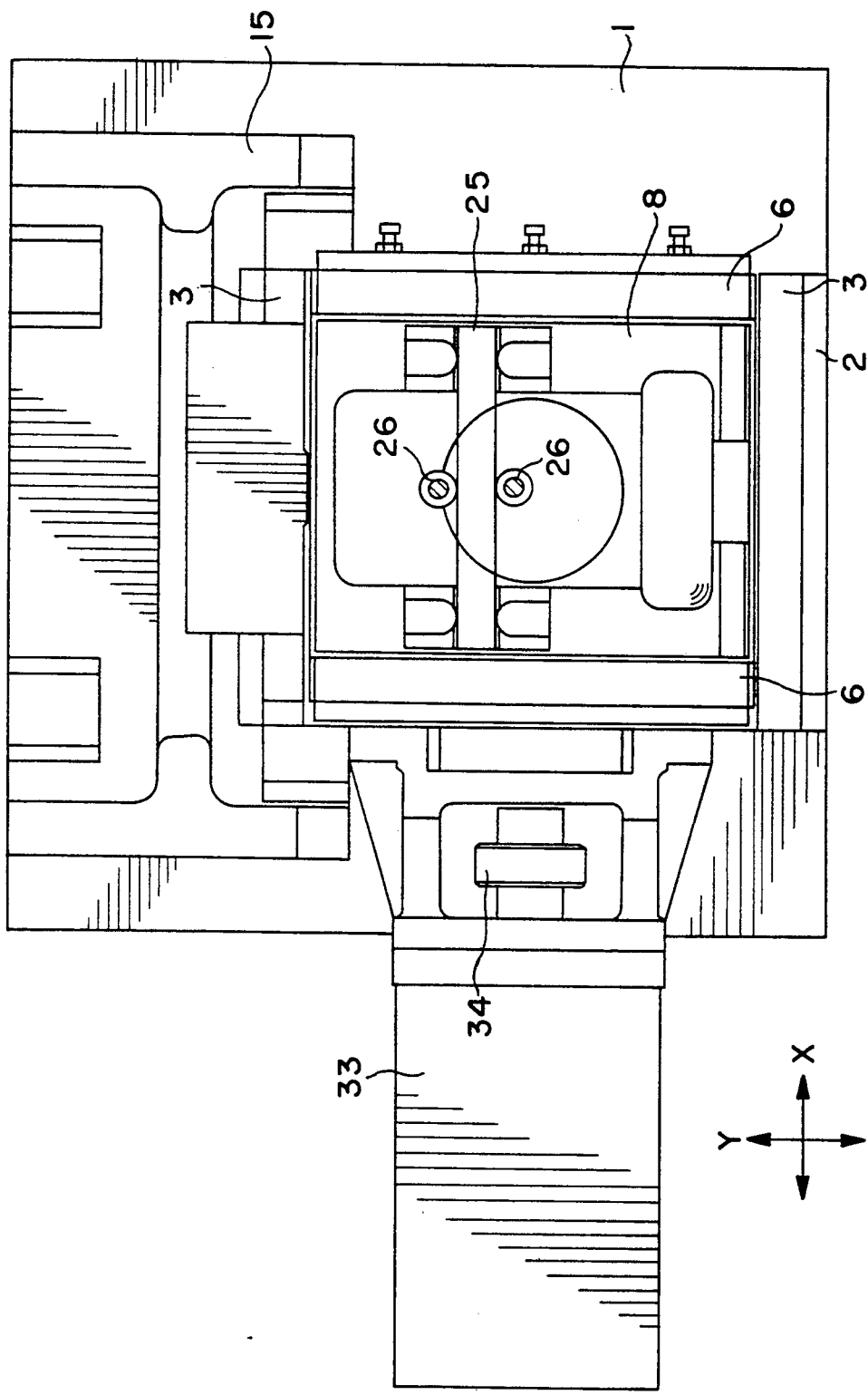
FIG. 4 is a cross-sectional plan view taken along the line 4—4 in FIG. 1.

One embodiment of the present invention will be described with reference to the accompanying drawings.

A bridge 2 is mounted on the upper surface of a base 1, and a pair of guide rails 3, which are positioned parallel to each other and extend in the X direction in the figures, are provided on the bridge 2. A lower table 5 is supported between the guide rails 3 via balls or rollers 4 so that the lower table 5 is capable of making a linear movement.

A pair of guide rails 6 which are positioned parallel to each other and extend in the Y direction in the figures (i.e., in the direction perpendicular to the guide rails 3) are provided on the upper surface of the lower table 5. An upper table 8 is supported between the guide rails 6 via balls or rollers 7 so that the upper table 8 is capable of making a linear movement in the Y direction (i.e., in the direction perpendicular to the direction of movement of the lower table 5).

A bridge 15 is mounted on the upper surface of the base 1 so that the bridge 15 straddles the upper table 8. pair of guide rails 16, which are parallel to each other and extend in the same direction as the direction of the movement of the upper table 8 (i.e., the Y direction), are provided on the bridge 15. An upper table driving deck 18 is supported between the guide rails 16 via balls or rollers 17 so that the upper table driving deck 18 is able to move in the direction of the movement of the upper table 8.

A guide 25 which extends in the moving direction of the lower table 5 is mounted on the upper surface of the upper table 8. A pair of cam followers 26 which are positioned on the both sides of the guide 25 are rotatably supported on the upper table driving deck 18. The upper table driving deck 18 is located immediately above the guide 25. Thus, the feeding action of the upper table driving deck 18 can make a feeding action of the upper table 8.

A feed screw 30 which is oriented in the direction of movement of the lower table 5 (i.e., in the X direction) is rotatably supported by bearings 31 and 32 on the bridge 2. This feed screw 30 is linked by a coupling 34 to the output shaft 33a of a feed motor 33 which is controlled by a control device (not shown). A feed nut 35 which is fixed to the lower table 5 is also screw-engaged with the feed screw 30. Accordingly, the lower table 5 can be moved in the X direction by (the rotation of) the feed motor 33.

A box-form frame 19 is mounted to the top of the bridge 15, and a feed screw 40 which is oriented in the direction of movement of the upper table driving deck 18 (i.e., in the Y direction) is rotatably supported by bearings 41 and 42 in the box-form frame 19. This feed screw 40 is linked via a coupling 44 to the output shaft 43a of a feed motor 43 which is controlled by a control device (not shown). A feed nut 45 which is fastened to the upper table driving deck 18 is screw-engaged with the feed screw 40. Accordingly, the upper table driving deck 18 can be moved in the Y direction by (the rotation) of the feed motor 43.

The operation of the X-Y table thus constructed will be described below.

The feeding action of the lower table 5 is accomplished by a known feed screw mechanism, so that when the feed motor 33 is activated and rotates in accordance with a command from the control device (not shown), a desired amount of linear feeding made by the rotation of the motor 33 is obtained. Since the upper table 8 is carried on the lower table 5, the upper table 8 moves along with the lower table 5 in the X direction. In this case, when the upper table 8 moves in the X direction, the guide 25 moves in the direction of its own extension with respect to the two cam followers 26, thus not affecting to the upper table driving deck 18.

Then, when the feed motor 43 is activated and rotates in accordance with a command from the control device (not shown), a desired amount of linear feeding of the upper table driving deck 18 is obtained by the known feed screw mechanism as mentioned above. This linear feeding action becomes a moving action of the upper table 8 in the Y direction (perpendicular to the direction of movement of the lower table 5) via the two cam followers 26 and the guide 25.

Ordinarily, in a bonding apparatus, a bonding head is installed on the upper table 8 of the X-Y table. Thus, the desired bonding work is accomplished by feeding the upper table 8 in the Y direction.

Thus, since the upper table feed-driving means which moves the upper table 8 (that is made up with the feed screw 40, the feed motor 43, the feed nut 45, etc.) is not installed on the lower table 5, the feed-driving means does not affect the feeding system of the lower table 5 as in conventional devices. In addition, since the bridge 15 straddles the upper table 8, and since the upper table feed-driving means (that comprises the feed screw 40, feed motor 43, feed nut 45 etc. and drives the upper table 8) is provided on the bridge 15 (forming as a whole a three-dimensional overlapping configuration), the installation area to be occupied by the X-Y table can be minimized.

In the embodiment described above, screw mechanisms are used as the feed-driving means for the lower table 5 and upper table driving deck 18. However, it is possible to use a non-rotary direct-advance feed-driving means described in Japanese patent application publication (Kokoku) No. 1-41466.

In the present invention, as is clear from the above description, since the feed-driving means for the upper table is positioned above the upper table in a three-dimensionally overlapping configuration, the device is compact, and the area required for installation is reduced.

We claim:

1. An X-Y table for use in semiconductor assembly apparatuses, said X-Y table comprising:
   a base;
   a lower table which is provided on said base and moves in one direction in a horizontal plane;
   an upper table provided on said lower table and movable on said lower table in an other direction perpendicular to said one direction in said horizontal plane;
   a bridge provided on said base and straddling said upper table;
   an upper table driving deck which is supported by said bridge, said upper table driving deck for linearly moving said upper table in said other direction;
   a feed-driving means for said lower table;
   a feed-driving means for said upper table driving deck; and
   a linking means which links said upper table and said upper table driving deck so as to move them in the direction of movement of said upper table.

* * * * *